United States Patent [19]

Oie et al.

[11] Patent Number: 4,654,292

[45] Date of Patent: Mar. 31, 1987

[54] PHOTORESIST COMPOSITION CONTAINING A PYRAZOLE COMPOUND ANTI-HALATION AGENT

[75] Inventors: Masayuki Oie, Kamakura; Satoshi Ogawa, Tokyo; Sadao Sugimoto, Yokosuka; Masahiro Yamazaki, Yokohama; Katsuhiro Fujino, Kawasaki, all of Japan

[73] Assignees: Nippon Zeon Co., Ltd., Tokyo; Fujitsu Limited, Kanagawa, both of Japan

[21] Appl. No.: 776,781

[22] Filed: Sep. 17, 1985

[30] Foreign Application Priority Data

Sep. 19, 1984 [JP] Japan .................. 59-194582

[51] Int. Cl.$^4$ .................. G03C 1/52; G03C 1/71; C08C 19/00
[52] U.S. Cl. .................. 430/197; 430/286; 430/270; 430/519; 430/191; 430/196; 522/26; 522/62; 522/126; 522/75
[58] Field of Search .............. 430/196, 191, 519, 270, 430/286, 192, 197; 522/26, 62, 126, 75

[56] References Cited

U.S. PATENT DOCUMENTS

| 4,311,773 | 1/1982 | Kaneko et al. ............... | 430/196 X |
| 4,349,619 | 9/1982 | Kamoshida et al. ........... | 430/196 |
| 4,522,694 | 6/1985 | Schaefer ...................... | 522/26 X |

FOREIGN PATENT DOCUMENTS 51-37562  10/1976  Japan ................... 430/196

*Primary Examiner*—John E. Kittle
*Assistant Examiner*—Cynthia Hamilton
*Attorney, Agent, or Firm*—Sherman and Shalloway

[57] ABSTRACT

A photoresist composition comprising a conjugated diene polymer or its cyclized product, a photocuring agent soluble in an organic solvent and a pyrazole compound having a skeleton represented by the following formula.

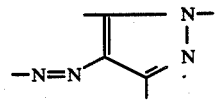

Also provided is a method of forming a photoresist pattern using the aforesaid composition.

7 Claims, No Drawings

PHOTORESIST COMPOSITION CONTAINING A PYRAZOLE COMPOUND ANTI-HALATION AGENT

This invention relates to a photoresist composition and its use. More specifically, it relates to a photoresist composition comprising a conjugated diene polymer or its cyclized product, a photocuring agent soluble in an organic solvent and a specific pyrazole compound, and to a method of forming a photoresist pattern using the composition.

In recent years, there has been a striking advance in the techniques of producing semiconductor integrated circuits such as IC and LSI, and it has been strongly desired to improve not only the production technology but also devices in which they are used and related materials. In the field of photoresists, too, there has been a demand for a photoresist composition having excellent handlability and a high resolution.

Cyclized polyisoprene-diazide compounds are now used in this field in negative photoresist compositions. These photoresists, however, have the defect that their resolution decreases on a thin film (to be referred to as a substrate) of, for example, aluminum having a high reflectance used in the manufacture of silicon semiconductor elements or chromium for photomasks. Specifically, during the process of exposure, the light which has passed through the light-pervious part of the mask falls upon the photoresist, is then reflected on the surface of the substrate, and gets into that region of the photoresist below the light-shielding part which is not desired to be exposed. Consequently, this region of the photoresist is undesirably exposed and a so-called halation phenomenon occurs. Consequently, a cured product called "tail" is formed, and the resolution is reduced. Simply stated, that region of the photoresist which should not be exposed is exposed to the reflected light, and consequently, the resolution of the photoresist is decreased.

A method for remedying this defect is proposed in Japanese Patent Publication No. 37562/1976. According to this method, the light transmitting property of a film of a photoresist composition is reduced by adding a light-absorbing material such as dimethylaminoazobenzene (Color Index No. 11020; trade name "Oil Yellow") to the photoresist composition.

A photoresist composition coated on a substrate is generally pre-baked at 80° to 100° C. for about 20 to 40 minutes in order to remove the remaining solvent. Since at this time, the light-absorbing material is volatilized from the film of the photoresist composition, its halation preventing effect is greatly affected by the treating conditions. Another defect is that the volatilization of the light-absorbing material is likely to form pinholes in the coated film of the photoresist composition or reduces the adhesion between the photoresist composition and the substrate, resulting in a decreased product yield.

It is an object of this invention to provide a photoresist composition free from the aforesaid defects of the prior art, namely a photoresist composition which can give an image of a high resolution with good reproducibility without being affected by the pre-baking conditions even when a substrate having a highly reflective surface is used, and of which the adhesion to the substrate does not decrease.

This object is achieved in accordance with this invention by a photoresist composition comprising a conjugated diene polymer or its cyclized product, a photocuring agent soluble in an organic solvent and a pyrazole compound having a skeleton represented by the following formula:

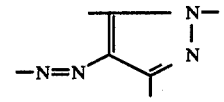

A photoresist pattern can be formed without the aforesaid defects by dissolving a solution of this composition in an organic solvent usually in a concentration of 5 to 30% by weight although the concentration may be varied depending upon the required film thickness, coating the solution on a substrate, and exposing the coated film through a mask of a predetermined pattern.

The conjugated diene polymer and its cyclized product used in this invention are selected from homopolymers of conjugated dienes, copolymers of conjugated dienes and monomers copolymerizable therewith, and cyclization product of these polymers or copolymers. Typical examples are natural rubber, polybutadiene, polyisoprene, isoprene/styrene copolymer, and cyclization products of these. Usually, those having a weight average molecular weight of 10,000 to 500,000 are preferred.

Typical examples of the organic solvents used in this invention are aromatic hydrocarbons such as benzene, toluene and xylene, halogenated hydrocarbons such as trichloroethylene, perchloroethylene, carbon tetrachloride, chlorobenzene and dichlorobenzene, and oxygen-containing hydrocarbons such as tetrahydrofuran and cyclohexanone.

The photocuring agent soluble in organic solvents which is used in this invention is, for example, an azide compound such as 4,4'-diazidostilbene, p-phenylenebisazide, 4,4'-diazidobenzophenone, 4,4'-diazidochalcone, 2,6-bis(4'-azidobenzal)cyclohexanone, 2,6-bis(4'-azidobenzal)-4-methylcyclohexanone and 4,4'-diazidodiphenyl.

As required, a stabilizer may be added to the composition of this invention.

The pyrazole compound used in this invention acts as an antihalation agent. It may contain any substituent if it has the azo group of the above skeleton. For example, it may be a compound of the following general formula

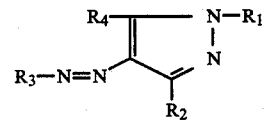

in which $R_1$, $R_2$, $R_3$ and $R_4$ each represent hydrogen, halogen, a hydroxyl group, a nitro group, a primary, secondary or tertiary amino group, an alkyl group, an alkoxy group, an aryl group or a substituted aryl group. Preferred compounds of the above formula are those in which $R_1$ is an alkyl group, an aryl group or an aryl group substituted by an alkyl or amino group, $R_2$ is hydrogen or an alkyl group, $R_3$ is an aryl group or an aryl group substituted by halogen, a nitro group, an alkyl group or an alkoxy group, and $R_4$ is hydrogen, a hydroxyl group, an alkyl group or an aryl group. Specific examples of the pyrazole compound include 5-methyl-1-phenyl-4-phenylazopyrazole, 5-ethyl-3-methyl-1-phenyl-4-phenylazopyrazole,
3,5-dimethyl-1-phenyl-4-(2,5-dichlorophenylazo)-
 pyrazole,
1-phenyl-4-phenylazo-5-oxypyrazole,
3-methyl-1-phenyl-4-phenylazo-5-oxypyrazole,
1-phenyl-4-(2,5-dichlorophenylazo)-5-oxypyrazole,
1-ethyl-3-methyl-4-(4-chloro-2-methylphenylazo)-5-
 oxypyrazole,
3-methyl-1-p-tolyl-4-(2-methoxy-4-nitrophenylazo)-5-
 oxypyrazole,
3-ethyl-1-phenyl-4-(4-methoxy-2-nitrophenylazo)-5-
 oxypyrazole,
3-methyl-1-phenyl-4-(2,4,5-trichlorophenylazo)-5-oxy-
 pyrazole,
3-methyl-1-phenyl-4-(4-chloro-2-nitrophenylazo)-5-
 oxypyrazole,
1-p-dimethylaminophenyl-3-methyl-4-phenylazo-5-
 oxypyrazole,
1-p-dimethylaminophenyl-3-methyl-4-(4-methyl-2-
 chlorophenylazo)-5-oxypyrazole, and
1-p-dimethylaminophenyl-3-methyl-4-(4-methyl-2-
 nitrophenylazo)-5-oxypyrazole.

The pyrazole compound is added usually in an amount of 1.0 to 10.0 parts by weight, preferably 3.0 to 5.0 parts by weight, per 100 parts by weight of the conjugated diene polymer or its cyclized product. If its amount is less than 1.0 part, its antihalation effect is not sufficient. If its amount exceeds 10.0 parts by weight, the adhesion between the photoresist film and the substrate is reduced, or the ratio of the film remaining after development decreases undesirably.

A resist pattern can be formed from the photoresist composition of this invention by applying usual methods. For example, the photoresist composition is dissolved in an organic solvent in a concentration of 5 to 30% by weight, and the solution is coated on a substrate. The coated film is then exposed through a mask of a predetermined pattern. Subsequent development and rinsing gives a photoresist pattern.

By using the photoresist composition of this invention, a photoresist pattern can be formed with good producibility even on such a substrate as aluminum or chromium having a high reflectance and a stepped structure without influences of the prebaking conditions, pinhole formation, a reduction in adhesion, and a reduction in resolution attributed to halation.

The following examples illustrate the present invention in more detail.

EXAMPLE 1

Twelve grams of a cyclization product of cis-1,4-polyisoprene obtained by using an Li catalyst (weight average molecular weight 150,000; proportion of unreacted isoprene 25%) was dissolved in 88 g of xylene. To the resulting solution were added 0.36 g of 2,6-bis(4'-azidobenzal)-4-methylcyclohexanone, 0.12 g of 2,2'-methylenebis(4'-methyl-6-t-butyl)phenol as a stabilizer and a predetermined amount of 1-phenyl-4-(2,5-dichlorophenylazo)-5-oxypyrazole to form a photoresist composition.

The photoresist composition was coated on a thin film of aluminum formed on a silicon substrate, and pre-baked at 85° C. for 20 minutes to form a photoresist film having a thickness of 1 micrometer. The photoresist film was exposed through a photomask having a test pattern by using an exposing device equipped with a 200W high-pressure mercury lamp (PLA-501F producd by Canon Co., Ltd.) for a predetermined period of time, then developed by immersing it for 1 minute in an n-heptane developer, and rinsed with n-butyl acetate for 1 minute. The results are shown in Table 1.

The exposure time employed was three times the sensitivity of each photoresist composition determined in a customary manner from a curve of the ratio of the remaining film (the time required until photocuring reaction is started from the starting of exposure). This exposure time is sufficient to complete photocuring reaction.

Table 1 shows clearly that as the amount of the antihalation agent added increases, the exposure time becomes longer and its halation preventing ability increases. In any of Runs Nos. 1 to 5, finer lines were resolved than in the comparison, and no tail formed. It is seen therefore that by adding the antihalation agent in accordance with this invention, the resolution of the photoresist can be markedly increased even on the aluminum substrate having a high reflectance.

TABLE 1

| | Run No. | Amount of 1-phenyl-4-(2,5-dichlorophenylazo)-5-oxypyrazole (parts by weight) | Exposure time (sec.) | Resolution ($\mu$m) | Tail |
|---|---|---|---|---|---|
| Invention | 1 | 1 | 6 | 1.8 | No |
| | 2 | 3 | 9.6 | 1.8 | No |
| | 3 | 5 | 15.9 | 1.7 | No |
| | 4 | 7 | 22.5 | 1.8 | No |
| | 5 | 10 | 30.9 | 1.9 | No |
| Comparison | 6 | 0 | 3 | 2.5 | Yes |

EXAMPLE 2

The same experiment as in Example 1 was repeated except that a wafer obtained by growing a heat-oxidized silicon film having a thickness of 0.5 micrometer was used as the substrate. After development, the wafer was post-baked in nitrogen at 150° C. for 30 minutes and then etched at 25° C. for 30 minutes by using an etchant composed of a mixture of a 40% aqueous solution of HF, a 40% aqueous solution of NH$_4$F and water in a volume ratio of 1:6:10. The results are shown in Table 2.

It is seen from Table 2 that the side etch of the composition of this invention was smaller than that of the comparison (5.3 micrometers) in which Oil Yellow (trade name), a known light absorbing material, was used, and that the composition of this invention showed good adhesion.

The side etch is a phenomenon wherein the wafer beneath the film of the photoresist composition, depending upon the degree of adhesion between the film and the wafer, is etched by the etchant which has got into that part.

TABLE 2

| | Run No. | Amount of 1-phenyl-4-(2,5-dichlorophenylazo)-5-oxypyrazole (parts by weight) | Exposure time (sec.) | Side etch ($\mu$m) |
|---|---|---|---|---|
| Invention | 7 | 1 | 6 | 1.8 |
| | 8 | 3 | 9.6 | 1.8 |
| | 9 | 5 | 10.9 | 1.8 |
| | 10 | 7 | 22.5 | 2.5 |
| | 11 | 10 | 30.9 | 5.2 |
| Comparison | 12 | Oil Yellow 3 parts | 11.4 | 5.3 |

It is clearly seen from the results shown in Table 2 that the use of the antihalation agent in accordance with this invention markedly increases the resolution of the photoresist composition on a substrate having a high reflectance, and improves the adhesion of a film of the composition to the substrate.

EXAMPLE 3

Example 1 was repeated except that 1-p-dimethylaminophenyl-3-methyl-4-phenylazo-5-oxypyrazole was used as the antihalation agent. The resolution was measured in the same way as in Example 1, and the results are shown in Table 3.

It is seen from the results given in Table 3 that in Runs Nos. 13 to 17 in accordance with this invention, as the amount of the antihalation agent increases, the sensitivity decreases and the light absorbing ability of the antihalation agent increases; that finer lines could be resolved than in the comparison (Run No. 18); and that the phenomenon of "tail" did not occur.

TABLE 3

|  | Run No. | Amount of 1-p-dimethylaminophenyl-3-methyl-4-phenylazo-5-oxypyrazole (parts by weight) | Exposure time (sec.) | Resolution ($\mu$m) | Tail |
| --- | --- | --- | --- | --- | --- |
| Invention | 13 | 1 | 6.2 | 1.8 | No |
|  | 14 | 3 | 9.2 | 1.8 | No |
|  | 15 | 5 | 15.6 | 1.8 | No |
|  | 16 | 7 | 22.5 | 1.8 | No |
|  | 17 | 10 | 30.0 | 2.0 | No |
| Comparison | 18 | 0 | 3.0 | 2.5 | Yes |

EXAMPLE 4

Example 2 was repeated except that 1-p-dimethylaminophenyl-3-methyl-4-phenylazo-5-oxypyrazole was used as the antihalation agent. The adhesion of the photoresist composition was measured in the same way as in Example 2, and the results are shown in Table 4.

In Runs Nos. 19 to 23 (invention), the amount of side etch is smaller than that of Run No. 24 (comparison) which is 5.3 micrometers, and thus showed better adhesion.

TABLE 4

|  | Run No. | Amount of 1-p-dimethylaminophenyl-3-methyl-4-phenylazo-5-oxypyrazole (parts by weight) | Exposure time (sec.) | Side etch ($\mu$m) |
| --- | --- | --- | --- | --- |
| Invention | 19 | 1 | 6.2 | 1.7 |
|  | 20 | 3 | 9.2 | 1.8 |
|  | 21 | 5 | 15.6 | 1.8 |
|  | 22 | 7 | 22.6 | 2.7 |
|  | 23 | 10 | 30.0 | 5.1 |
| Comparison | 24 | Oil Yellow 3 parts | 11.4 | 5.3 |

EXAMPLE 5

The thermal properties of the antihalation agents used in Examples 1 to 4 and the conventional light-absorbing material, Oil Yellow (trade name), were examined by a differential thermal analyzer (DTA). The results are shown in Table 5.

While the conventional light-absorbing material sublimed at about 90° to 100° C., the antihalation agents in accordance with this invention showed a weight loss initiation temperature of more than 150° C. and existed stably at ordinary wafer treating temperatures of 80° to 150° C. and thus can exhibit their effect.

TABLE 5

|  | Run No. | Antihalation agent | Weight loss initiation temperature (°C.) |
| --- | --- | --- | --- |
| Invention | 25 | 1-Phenyl-4-(2,5-dichlorophenylazo)-5-oxypyrazole | 180 |
|  | 26 | 1-p-Dimethylaminophenyl-3-methyl-4-phenylazo-5-oxypyrazole | 160 |
| Comparison | 27 | Oil Yellow | 95 |

In the foregoing examples, a silicon substrate was used. Needless to say, the present invention is not simply limited to the field of manufacturing silicon semiconductor elements, but can be applied to all fields of technology which utilize photoresist patterns as in germanium elements, hybrid elements and photomasks.

What is claimed is:

1. A photoresist composition comprising conjugated diene polymer or its cyclized product, a photocuring agent soluble in an organic solvent and a pyrazole compound represented by the general formula

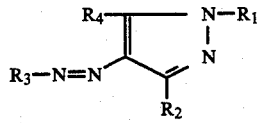

wherein $R_1$ is an alkyl, aryl or substituted aryl group, $R_2$ is hydrogen or an alkyl group, $R_3$ is an aryl or substituted aryl group, and $R_4$ is hydrogen, or a hydroxyl, alkyl or aryl group.

2. The composition of claim 1 wherein the conjugated diene polymer is selected from the group consisting of natural rubber, polyisoprene, isoprene/styrene copolymer and polybutadiene.

3. The composition of claim 1 wherein the photocuring agent is an azide compound.

4. The composition of claim 1 wherein the azide compound is selected from the group consisting of 4,4'-diazidostilbene, p-phenylenebisazide, 4,4'-diazidobenzophenone, 4,4'-diazidochalcone, 2,6-bis(4'-azidobezal)cyclohexanone, 2,6-bis(4'-azidobenzal)-4methylcyclohexanone and 4,4'-diazidodiphenyl.

5. The composition of claim 1 wherein the pyrazole compound is selected from the group consisting of
5-methyl-1-phenyl-4-phenylazopyrazole,
5-ethyl-3-methyl-1-phenyl-4-phenylazopyrazole,
3,5-dimethyl-1-phenyl-4-(2,5-dichlorophenylazo)-parazole,
1-phenyl-4-phenylazo-5-oxypyrazole,
3-methyl-1-phenyl-4-phenylazo-5-oxypyrazole,
1-phenyl-4-(2,5-dichlorophenylazo)-5-oxypyrazole,
1-ethyl-3-methyl-4-(4-chloro-2-methylphenylazo)-5-oxypyrazole,
3-methyl-1-p-tolyl-4-(2-methoxy-4-nitrophenylazo)-5-oxypyrazole,
3-ethyl-1-phenyl-4-(4-methoxy-2-nitrophenylazo)-5-oxypyrazole,
3-methyl-1-phenyl-4(2,4,5-trichlorophenylazo)-5-oxypyrazole, 3-methyl-1-phenyl-4-(4-chloro-2-nitrophenylazo)-5-oxypyrazole, 1-p-dimethylaminophenyl-3-methyl-4-phenylazo-5-oxypyrazole, 1-p-dimethylaminophenyl-3-methyl-4-(4-methyl-2-chlorophenylazo)-5-oxypyrzole, and 1-p-dimethylaminophenyl-3-methyl-4-(4-methyl-2-nitrophenylazo-5-oxypyrazole.

6. The composition of claim 1 which comprises from 1.0 to 10.0 parts by weight, per 100 parts by weight of the conjugated diene polymer or its cyclized product, of the pyrazole compound.

7. The composition of claim 1 which comprises from 3.0 to 5.0 parts by weight, per 100 parts by weight of the conjugated diene polymer or its cyclized product, of the pyrazole compound.

* * * * *